United States Patent [19]
Ogata et al.

[11] Patent Number: 4,874,436
[45] Date of Patent: Oct. 17, 1989

[54] METHOD FOR PRODUCING HIGH PURITY ELECTROLYTIC COPPER

[75] Inventors: Takashi Ogata, Toda; Masanori Kato, Tokyo; Yoshio Kawasumi, Toda; Chikara Tominaga, Tokyo; Kanji Tanaka, Ohita, all of Japan

[73] Assignee: Nippon Mining Co., Ltd., Tokyo, Japan

[21] Appl. No.: 237,492

[22] Filed: Aug. 26, 1988

Related U.S. Application Data

[62] Division of Ser. No. 80,336, Jul. 30, 1987, Pat. No. 4,792,369.

[30] Foreign Application Priority Data

Feb. 19, 1987 [JP] Japan .................. 62-34434
Jun. 26, 1987 [JP] Japan .................. 62-157565
Jun. 26, 1987 [JP] Japan .................. 62-157566

[51] Int. Cl.$^4$ .................. B22D 25/00; C25C 1/12
[52] U.S. Cl. .................. 148/2; 148/11.5 C; 148/404; 204/106; 204/108; 204/146; 72/205; 72/224; 75/109; 75/118 R; 164/476; 164/488; 164/490

[58] Field of Search .................. 204/106, 105 R, 146; 75/118 R, 109; 72/205, 224; 164/476, 488, 490; 148/2, 11.5 C, 404

[56] References Cited

U.S. PATENT DOCUMENTS

| | | | |
|---|---|---|---|
| 3,692,647 | 9/1972 | Chambers et al. | 204/105 R |
| 4,076,605 | 2/1978 | Bilson | 204/108 |
| 4,090,935 | 5/1978 | Dunning et al. | 204/146 |
| 4,124,379 | 11/1978 | Peters et al. | 75/118 R |

Primary Examiner—John F. Niebling
Assistant Examiner—David G. Ryser
Attorney, Agent, or Firm—Flynn, Thiel, Boutell & Tanis

[57] ABSTRACT

A method is provided for producing high purity electrolytic copper useful, for example, to make a copper wire for use in sound or image reproducing systems, such as audio, video and television systems, etc. The copper wire consists of high purity copper in which silver and sulfur contents are both not more than 0.5 ppm and preferably has a crystal grain size not less than 0.02 mm and is unidirectionally solidified or is a single crystal. Such a copper wire is manufactured by continuously casting electrodeposited copper which has been obtained by refining by re-electrolysis of electrolytic copper, using a specially arranged casting apparatus having a mold projecting to an electrolytic bath.

18 Claims, 3 Drawing Sheets

METHOD FOR PRODUCING HIGH PURITY ELECTROLYTIC COPPER

BACKGROUND OF THE INVENTION

This is a division of application Ser. No. 080,336 filed July 30, 1987, now U.S. Pat. No. 4,792,369.

1. Field of the Invention

The present invention relates to a method for producing high purity electrolytic copper useful, for example, to make a copper wire for use in sound or image reproducing systems, such as audio, video and television systems, etc.

2. Description of the Prior Art

In the wiring of sound facilities, such as audio, or image reproducing facilities, for example video sets or television sets, copper wires, particularly usual oxygen-free copper wires have been heretofore used. However, there has been still room for improvement in sound quality, particularly, with respect to high-fidelity sound reproduction in the entire audio range including the bass range and the treble range, and clearness of pictures reproduced on large-sized display screens of video or television systems.

Among known production processes of the above mentioned copper wires for recording or transmitting sounds or images, there has been known a continuous casting process using a heated mold, as described in Japanese Patent Application Laid-Open No. 60-20339. In this process, a casting mold is heated, as disclosed in Japanese Patent Publication No. 55-46265, and, thus, the casting rate is not so high and breakout problems of melt are not completely eliminated. Further, the process is also unfavorable from the structural viewpoint, since in this process a heating means is required to be incorporated into a casting mold for heating the casting mold itself.

Accordingly, an object of the present invention is to provide a method for producing high purity electrolytic copper which can be used, for example, to make copper wires enabling transmitting or reproducing sounds or images with a high fidelity and a method for producing such copper wires.

SUMMARY OF THE INVENTION

In one aspect of this invention, there is provided a method for producing high purity electrolytic copper which can be used, for example, to make high purity copper containing not more than 0.5 ppm silver and not more than 0.5 ppm sulfur. Preferably, the silver content and the sulfur content do not exceed 0.1 ppm and 0.01 ppm, respectively.

The high purity copper can be used to make copper wire for recording or transmitting sounds or images, the copper wire consisting of high purity copper with not more than 0.5 ppm silver and not more than 0.5 ppm sulfur and being unidirectionally solidified or being a single crystal.

The high purity copper wire as specified above makes possible the high-fidelity sound reproduction over the entire audible range including high-pitched sounds and low-pitched sounds when it is used for sound recording, transmitting and reproducing. Further, when the copper wires are used for the purpose of image recording, transmitting and reproducing, they can reproduce distinct images and are also suitable for use in large-sized image-display screens.

The copper wires of the present invention set forth above are useful as pin cords, F plug cords, antenna cords and wiring cords used in various equipments.

In the manufacture of the high purity copper wires set forth above, a molten metal of high purity copper in which silver and sulfur are each controlled to amounts not exceeding 0.5 ppm is continuously cast to produce a cast article, using a continuous casting apparatus so designed that one end of a casting mold projects into a molten metal bath and the other end contacts with a cooling structure. If necessary, thereafter, the resulting cast article may be subjected to wire drawing and/or annealing.

In the process of the present invention, since one end of the casting mold projects into the molten high-purity copper bath, an additional heating means is not required. Therefore, the solidified surface can be maintained near the inlet side of the molten metal bath without overheating. Further, the process of the present invention facilitates the unidirectional solidification or formation of a single crystal. A reduced casting rate makes possible the production of single crystals.

Since the other end of the casting mold is in contact with the cooling structure, there is no molten metal at the outlet side of the casting mold. In such a construction, continuous casting can be carried out without breakout.

When a pulse drawing is used in the foregoing casting process in order to obtain cast products having a large crystal grain size without causing breakout problems, there can be obtained products having a uniform quality in a stable casting operation.

"Pulse drawing" is a drawing technique which involves repeating the operations of stopping drawing for a certain period of time and then drawing. As an example there, may be mentioned an intermittent drawing procedure with stopping drawing for 2 to 10 seconds and then drawing for 0.1 to 1 second. When the pulse drawing is employed, there can be attained unidirectionally solidified or single crystal products even when a casting mold slightly projects into the molten metal bath, as referred to an apparatus in FIG. 5 described hereinafter.

The casting rate is preferably in the range of 5 to 150 mm per minute and, more preferably, 10 to 70 mm per minute. When the casting rate is in the range, the grain boundaries of the resulting copper wires are considerably reduced. The term "casting rate" is calculated by dividing the length of a drawn cast product by the drawing time and, when the pulse drawing is employed, it is obtained by dividing the length of a drawn cast product by the total of intermittent stopping time and the drawing time.

In the foregoing continuous casting process, when an inert gas or a neutral gas is injected prior to the solidification of the molten metal or during the solidification, columnar crystals occur at the solidification front and unidirectional solidification can be advantageously achieved.

The molten metal used in the continuous casting process according to the present invention consists of high purity copper which has been obtained by electrolyzing electrolytic copper, previously obtained by electrolysis, or equivalent thereof, in an electrolytic solution, as described hereinafter.

DETAILED DESCRIPTION OF THE PREFERRED EMBODIMENTS

Figure 1:
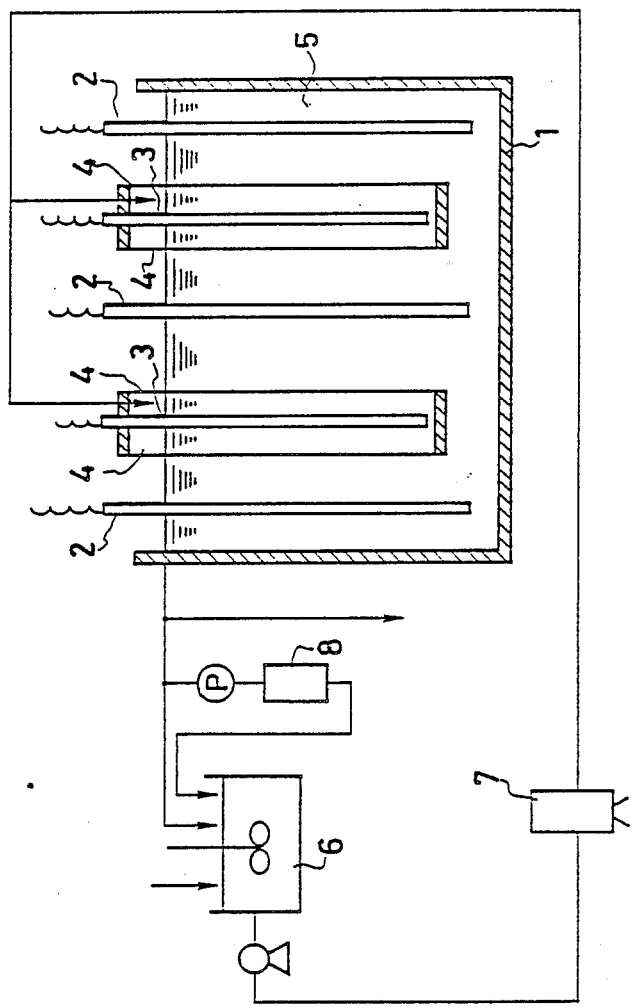
FIG. 1 is an explanatory view illustrating an embodiment of an apparatus employed for obtaining high-purity electrolytic copper which is used as a starting material in practicing the present invention.

In order to successfully carry out the continuous casting set forth above, refractory materials having a good heat-conductivity are preferably used as a material of the casting mold. Examples of such refractory materials include silicon nitride, silicon carbide, graphite, etc., and, particularly, the use of graphite reduces the oxygen content of the resulting products to the level of about 3 ppm.

The casting apparatus used in the present invention may be either a casting apparatus having a casting mold at the side wall of a melting furnace or a holding furnace or a casting apparatus having a casting mold in the vertical direction to the furnace.

The present invention is not so suitable for the manufacture of large-diameter products. The reason for this is that heat should be transmitted from the casting mold to a molten metal or semi-solid metal in order to make possible the unidirectional solidification or formation of a single crystal.

The high purity copper used as the molten metal in the foregoing continuous casting can be obtained by electrolyzing electrolytic copper, which has previously obtained by electrolysis or equivalent thereof, in a mineral acid electrolytic solution.

As the mineral acid used for the preparation of the electrolytic solution, nitric acid or sulfuric acid may be employed. An electrolytic bath of nitric acid reduces the inclusion of sulfur into the products, while an electrolytic bath of sulfuric acid tends to cause the inclusion of sulfur. Therefore, in the latter case, electrolysis is preferably conducted, for example, by a short period PR (periodic reverse) electrolyzing process.

The current density and holding time for electrodeposition are preferably from 0.2 to 10 A/dm$^2$ and from 10$\mu$ sec. to 2000 msec., respectively. The current density and holding time for dissolving the electrodeposited copper are preferably in the ranges of 0.05 to 5 A/dm$^2$ and 10$\mu$ sec. to 1000 msec., respectively.

A current density of 1 to 6 A/dm$^2$ and a holding time of 0.1 to 60 msec. are more preferable for electrodeposition and a current density of 0.2 to 3 A/dm$^2$ and a holding time of 0.1 to 60 msec. are more preferable for dissolving the electrodeposited copper.

When an electrolytic bath of nitric acid is used, the concentration of nitric acid is so adjusted as to maintain the pH of the bath in the range of 3 or lower and preferably, in the range of 1.5 to 2.0.

Further, during the electrolyzing process, an anode and a cathode are preferably partitioned by a diaphragm. The principal purpose of the use of the diaphragm resides in isolation of the cathode from impurities produced due to dissolution of the anode. The impurities are roughly classified into solid matter which settles to the bottom, suspending solid matter or dissolved matter.

As the diaphragm, ion exchange membrane, cloth or ceramic may be used and, preferably, acid resistant cloth made of, for example, Teviron, Tetron or other synthetic fibers are preferable.

Silver present in the electrolytic solution discharged from an anode side is removed by contacting the solution with metal copper and/or using chlorine ion of hydrochloric acid, etc., in the solution. In some cases, it is advantageous to pass the discharged solution through an activated carbon filter.

Further, when the discharged solution is filtered through a filter material having pores of 0.1 to 2 microns in diameter after desilverization, removal of the foregoing impurities can be more reliably effected.

In such a re-electrolyzing treatment, there can be obtained high-purity copper in which the silver content and the sulfur content are not more than 0.5 ppm for each metal and the oxygen content is of the level of about 6 ppm. The copper thus re-electrolyzed is cast according to the continuous casting process set forth above and, as necessary, further subjected to wire drawing and/or annealing. By such procedures there can be obtained copper wires exhibiting superior properties in recording or transmitting sounds or images.

As described above, the copper wires for sound or image recording or transmitting according to the present invention consist of high purity copper with silver and sulfur in amounts not exceeding 0.5 ppm for each element and such a high purity copper can be obtained by electrolytically refining electrolytic copper, for example, using an apparatus shown in FIG. 1 and then casting using the above-mentioned continuous casting apparatus.

The present invention will now be described in detail with reference to the following Examples.

EXAMPLES

In FIG. 1, there are shown an electrolytic cell 1, an anode 2 composed of electrolytic copper and a cathode 3. The anode 2 and the cathode 3 are immersed in an electrolytic solution 5 consisting mainly of nitric acid and the cathode 3 is surrounded by a diaphragm 4. Numeral 6 indicates a stirring cell and the electrolytic solution pumped out of the electrolytic cell 1 flows into the stirring cell 6 and, as necessary, an appropriate amount of fresh electrolytic solution is supplied. Thereafter, the electrolytic solution flows into a tank filter 7. After contacting the electrolytic solution with metallic copper in the presence of chlorine ion of hydrochloric acid, etc., silver contained in the electrolytic solution is removed in the tank filter 7. Reference numeral 8 indicates an activated carbon cell.

Referring to a practical example, electrolytic copper (composition grade: 13.9 ppm Ag, 11.0 ppm S, 0.5 ppm As, 0.3 ppm Sb, 0.7 ppm Pb, and 10 ppm Oxygen) and Ti were used as the anode 2 and the cathode 3, respectively. Tetron, commercially available as the trade name "TR 84501" from Kitamura Seifu Kabushiki Kaisha, was arranged in the surrounding of the cathode 3 as the diaphragm 4 dividing the electrolytic solution into an anode chamber and a cathode chamber and isolating the cathode 3. The electrolytic solution 5 was circulated in such a manner that the contaminated electrolytic solution drained from the anode chamber was returned to the cathode chamber after desilvering treatment. The desilverizing treatment was carried out by adding hydrochloric acid in the concentration of 100±10 mg/l, calculated as chlorine, and contacting the electrolytic solution with metallic copper for 4.0 hours in the stirring cell 6. After the desilverization, the electrolytic solution was filtered through a Millipore Filter having a pore size of 0.2 micron in diameter and then fed again to the cathode chamber. A feed rate per cathode was 1.65 cm/hour. The electrolytic bath was a nitric acid electrolytic bath containing copper in an amount of 50 g/l and the pH was maintained at 1.7. The temperature of the electrolytic bath was in the range of 22° to 27° C. The current density was 1.0 A/dm$^2$ and the distance between the anode 2 and the cathode 3 was 40 mm. After continuously applying current of a period of 10 days, the cathode 3 was taken out and copper electrodeposited was stripped from the Ti plate. The stripped copper was washed and dried. There was obtained the desired high-purity copper. It was found that the obtained copper contained not more than 0.05 ppm of sulfur, 0.3 ppm of silver, not more than 0.05 ppm of iron and 6 ppm of oxygen and was extremely pure.

Figure 2:
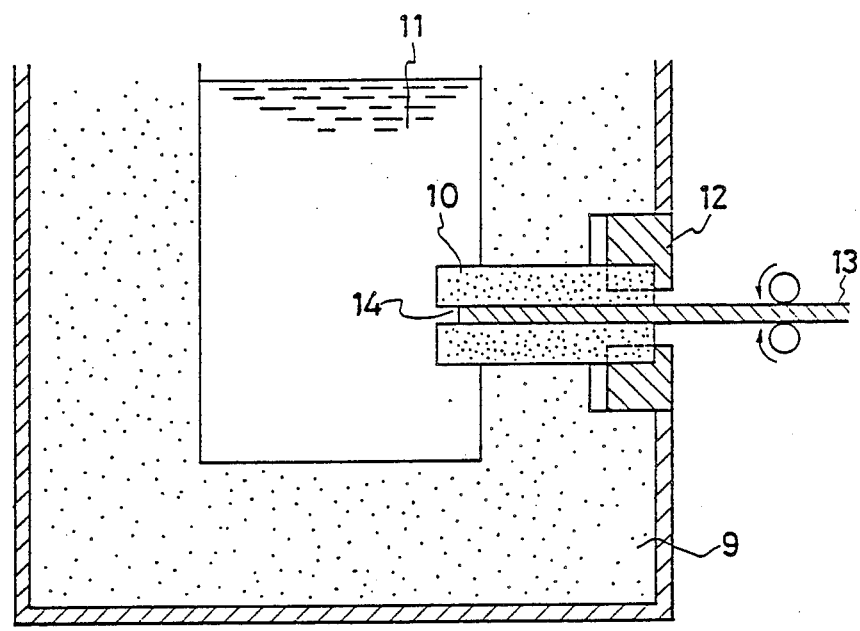
FIG. 2 is a view illustrating an embodiment of a continuous casting apparatus for carrying out the present invention.

The high-purity copper was unidirectionally solidified using the casting apparatus shown in FIG. 2. In FIG. 2, reference numeral 9 indicates a melting furnace and a casting mold 10 made of graphite was disposed at a side wall of the bottom part of the furnace 9 in such an arrangement that one end of the casting mold 10 projected to the molten metal bath 11 and a cooling structure 12 was disposed at the other end of the casting mold 10.

Firstly, a pure copper rod 13 having an outside diameter of 10.6 mm was inserted into a hole of 11 mm in diameter formed in the graphite casting mold 10 in such a manner that the tip end of the copper rod 13 was positioned 1 cm inwardly from the molten metal inlet end of the hole. In the preparation of the molten metal bath 11, the foregoing pure copper was melted, put into the melting furnace 9. The molten metal bath was heated to 1250° C. and maintained at the temperature. Water was passed at a flow rate of 8 liters per minute to the cooling structure 12 and the position of solidification of the high purity copper was set at the molten metal feed side of the casting mold. Pulse drawing was conducted by repeating the operations of continuously drawing out 1.5 mm of solidified rod for 0.5 second and intermittently stopping the drawing for 4 seconds.

The resulting high purity copper rod (sulfur: not more than 0.05 ppm, silver: not more than 0.3 ppm, Oxygen: 3 ppm) is almost in a single crystal structure free of grain boundary. The rod was further subjected to wire drawing operation to provide a wire of 0.025 to 0.6 mm in diameter and annealed at 400° to 800° C. The resultant product was used for wiring in a practical apparatus as a copper wire for recording and transmitting sounds or images. As a result, with respect to sounds, high-fidelity sound reproduction was achieved both in the treble range and the bass range and, with respect to images, distinct images were obtained even in the case of large-sized display screens. When the wires obtained after the final treatment has a crystal grain size of 0.02 mm or more, they were advantageously applied.

Figure 3:
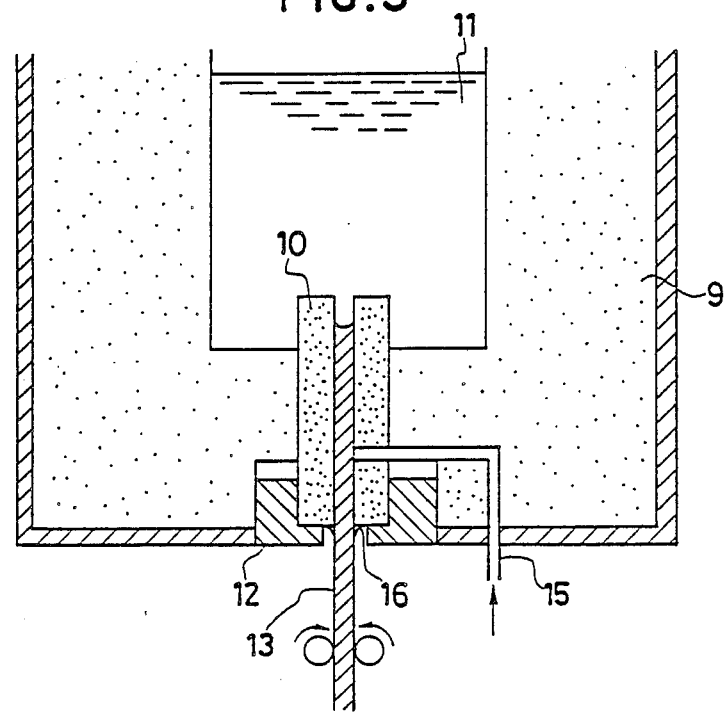
FIGS. 3, 4 and 5 are views illustrating further embodiments of continuous casting apparatuses.

FIG. 3 is another embodiment of a continuous casting apparatus in which drawing is carried out in the vertical direction. An inert gas introducing conduit 15 was open to the intermediate zone of the graphite casting mold 10. Throughout the continuous casting process, an inert gas was introduced and injected into the molten metal bath while covering the surface of a cast wire. The inert gas stirs the molten metal bath and thereby reduces non-uniformity in temperature and metal composition. In order to inject the inert gas only to the molten metal bath, a gas seal 16 was used at the outlet part from which cast wire was drawn out. A solidified wire was continuously drawn out at a rate of 20 mm/minute by means of pinch rolls. The inert gas may be introduced to the solidified surface of the molten metal in the casting mold 10.

The resulting high-purity copper wire was unidirectionally solidified and has an extremely large crystal grain size of 2 to 5 mm and a smooth surface. The copper wire thus obtained and the copper wire which was further subjected to wire drawing treatment both exhibited superior properties for use in recording and transmitting sounds or images.

Further, after obtaining the copper wire of 0.025 to 0.6 mm in diameter by wire drawing, the wire was annealed at 400° to 800° C. to provide a copper wire having a crystal grain size not less than 0.02 mm. The annealed copper wire was examined in the same way as described above and it has been found that when it has a crystal grain size not less than 0.02 mm, it can be advantageously used in achieving superior sound or image recording and transmitting. For instance, a copper wire having a crystal grain size of 0.09 mm which was obtained by annealing at 400° C. for two hours after wire drawing had very good properties.

Figure 4:
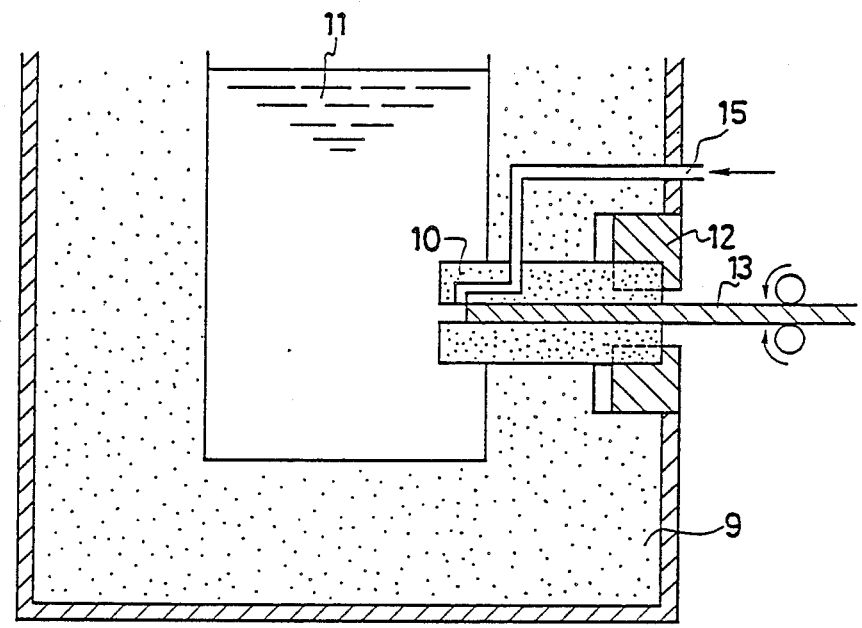

FIG. 4 shows an embodiment similar to FIG. 2 and including an inert gas introducing conduit 15 like the one shown in FIG. 3.

Figure 5:
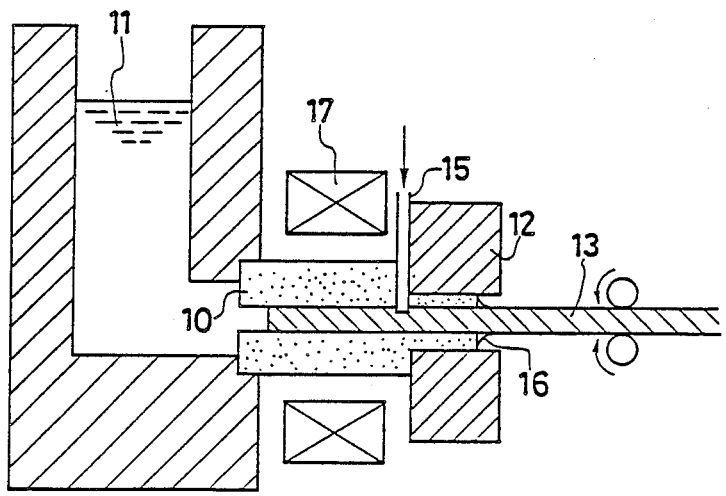

FIG. 5 shows a further embodiment of a continuous casting apparatus in which a casting mold 10 was partly projected into the molten metal bath 11. In such an apparatus, the pulse drawing previously described is particularly advantageous. In FIG. 5, reference numeral 17 indicates a heating unit for reserving heat which reduces the influence of the outside air temperature.

What is claimed is:

1. A process for the electrolytic refining of electrolytic copper containing silver, as an impurity, whereby to obtain highly pure copper containing not more than 0.5 ppm of silver and not more than 0.5 ppm of sulfur, using an electrolytic cell comprising anode means made of electrolytic copper, cathode means on which said highly pure copper is deposited and a nitric acid electrolytic solution, and in which diaphragm means is disposed between said anode means and said cathode means whereby the cell is divided into anode and cathode chamber means, which comprises the steps of: passing direct electrolysis current through said cell whereby said highly pure copper is deposited on said cathode means and silver is dissolved in the electrolytic solution in said anode chamber means, removing a portion of the silver-containing electrolytic solution from said anode chamber means, contacting said silver-containing electrolytic solution with metallic copper in the presence of chlorine ions effective to precipitate silver, then filtering said silver-containing electrolytic solution through a filter having a pore diameter of 0.1 micron to 2 microns and thereby separating the precipitated silver from the remainder of said electrolytic solution and recirculating the remainder of said electrolytic solution to said cathode chamber means.

2. A process for producing a casting made of highly pure copper containing not more than 0.5 ppm of silver and not more than 0.5 ppm of sulfur, which comprises the steps of melting highly pure copper obtained by the method claimed in claim 1, providing a bath of said molten, highly pure copper in a vessel, continuously casting the molten, highly pure copper into and through a casting mold having an inner end projecting into said bath and having an outer end located outside said bath and in heat exchange relationship with external cooling means whereby the casting is solidified as it passes from said inner end to said outer end of said casting mold and said casting has a large grain size.

3. A process as claimed in claim 2 in which the solidified casting is subjected to wire drawing to convert same into the shape of a wire.

4. A process as claimed in claim 3 in which the wire is annealed at a temperature of from 400° to 800° C. until it has a crystal grain size of at least 0.02 mm.

5. A process as claimed in claim 2 in which the solidified casting is annealed at a temperature of from 400° to 800° C.

6. A process as claimed in claim 2 in which the solidified casting is removed from the casting mold by cyclically repeating the steps of continuously drawing out the solidified casting from the casting mold for a first selected period of time and then stopping the drawing out of the solidified casting from the casting mold for a second selected period of time.

7. A process as claimed in claim 2 in which said casting has substantially a single crystal structure free of grain boundaries.

8. A process as claimed in claim 2 in which the solidified casting is removed from the casting mold at a rate of from 5 to 150 mm/min.

9. A process as claimed in claim 2 in which said casting is unidirectionally crystallized.

10. A process for the electrolytic refining of electrolytic copper containing silver, as an impurity, whereby to obtain highly pure copper containing not more than 0.5 ppm of silver and not more than 0.5 ppm of sulfur, using an electrolytic cell comprising anode means made of electrolytic copper, cathode means on which said highly pure copper is deposited and a sulfuric acid electrolytic solution, and in which diaphragm means is disposed between said anode means and said cathode means whereby the cell is divided into anode and cathode chamber means, which comprises the steps of: passing direct electrolysis current through said cell whereby said highly pure copper is deposited on said cathode means and silver is dissolved in the electrolytic solution in said anode chamber means and periodically reversing the direction of current flow for a short time to reduce the inclusion of sulfur in the deposit on said cathode means, removing a portion of the silver-containing electrolytic solution from said anode chamber means, contacting said silver-containing electrolytic solution with metallic copper in the presence of chlorine ions effective to precipitate silver, then filtering said silver-containing electrolytic solution through a filter having a pore diameter of 0.1 micron to 2 microns and thereby separating the precipitated silver from the remainder of said electrolytic solution and recirculating the remainder of said electrolytic solution to said cathode chamber means.

11. A process for producing a casting made of highly pure copper containing not more than 0.5 ppm of silver and not more than 0.5 ppm of sulfur, which comprises the steps of melting highly pure copper obtained by the method claimed in claim 10, providing a bath of said molten, highly pure copper in a vessel, continuously casting the molten, highly pure copper into and through a casting mold having an inner end projecting into said bath and having an outer end located outside said bath and in heat exchange relationship with external cooling means whereby the casting is solidified as it passes from said inner end to said outer end of said casting mold and said casting has a large grain size.

12. A process as claimed in claim 11 in which the solidified casting is subjected to wire drawing to convert same into the shape of a wire.

13. A process as claimed in claim 12 in which the wire is annealed at a temperature of from 400° to 800° C. until it has a crystal grain size of at least 0.02 mm.

14. A process as claimed in claim 11 in which the solidified casting is annealed at a temperature of from 400° to 800° C.

15. A process as claimed in claim 11 in which the solidified casting is removed from the casting mold by cyclically repeating the steps of continuously drawing out the solidified casting from the casting mold for a first selected period of time and then stopping the drawing out of the solidified casting from the casting mold for a second selected period of time.

16. A process as claimed in claim 11 in which said casting has substantially a single crystal structure free of grain boundaries.

17. A process as claimed in claim 11 in which the solidified casting is removed from the casting mold at a rate of from 5 to 150 mm/min.

18. A process as claimed in claim 11 in which said casting is unidirectionally crystallized.

* * * * *